US012812823B2

(12) United States Patent
Akula et al.

(10) Patent No.: US 12,812,823 B2
(45) Date of Patent: Nov. 24, 2026

(54) HEAT SINK FOR POWER ELECTRONICS DEVICES

(71) Applicant: Carrier Corporation, Palm Beach Gardens, FL (US)

(72) Inventors: Kiran Kumar Akula, Hyderabad (IN); Zoila Malespin, Indianapolis, IN (US); Mohamad Nasab, Indianapolis, IN (US); Vijay Lakshmi Bondapalli, Hyderabad (IN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 680 days.

(21) Appl. No.: 17/986,640

(22) Filed: Nov. 14, 2022

(65) Prior Publication Data

US 2023/0164960 A1 May 25, 2023

Related U.S. Application Data

(60) Provisional application No. 63/282,294, filed on Nov. 23, 2021.

(51) Int. Cl.
*H05K 7/20* (2006.01)

(52) U.S. Cl.
CPC ......... *H05K 7/209* (2013.01); *H05K 7/20154* (2013.01); *H05K 7/20909* (2013.01); *H05K 7/20918* (2013.01); *H05K 7/20972* (2013.01)

(58) Field of Classification Search
CPC ............... H05K 7/209; H05K 7/20154; H05K 7/20909; H05K 7/20918; H05K 7/20972
USPC ......................................................... 165/80.2
See application file for complete search history.

(56) References Cited

U.S. PATENT DOCUMENTS

| | | | | |
|---|---|---|---|---|
| 6,229,232 | B1 | 5/2001 | Roth-Stielow et al. | |
| 7,903,415 | B2 | 3/2011 | Liu et al. | |
| 9,429,151 | B2 | 8/2016 | Taras et al. | |
| 10,250,104 | B2 | 4/2019 | Bradfield | |
| 10,390,466 | B2 | 8/2019 | Held et al. | |
| 10,411,560 | B2 | 9/2019 | Leli et al. | |
| 10,508,841 | B2 | 12/2019 | Roth | |
| 10,560,000 | B2 | 2/2020 | Giuliani et al. | |
| 2002/0075653 | A1* | 6/2002 | Lin | H01L 23/3672 257/E23.099 |
| 2007/0256812 | A1* | 11/2007 | Wei | H01L 23/3672 257/E23.099 |

(Continued)

FOREIGN PATENT DOCUMENTS

| | | | |
|---|---|---|---|
| CN | 208090844 | U * | 11/2018 |
| DE | 102005032968 | A1 | 2/2007 |

(Continued)

OTHER PUBLICATIONS

CN-208090844-U english translation (Year: 2018).*

*Primary Examiner* — Joel M Attey
(74) *Attorney, Agent, or Firm* — CANTOR COLBURN LLP

(57) ABSTRACT

A heat sink for cooling at least one power electronics device in a coil unit includes a base plate having a first portion and a second portion. The second portion is arranged vertically beneath the first portion. A plurality of fins extends from a surface of the base plate. The plurality of fins is located at the second portion of the base plate. A height of the plurality of fins measured perpendicular to the surface varies across a width of the base plate.

17 Claims, 11 Drawing Sheets

(56) References Cited

U.S. PATENT DOCUMENTS

| | | | | |
|---|---|---|---|---|
| 2007/0273220 | A1 | 11/2007 | Koyama et al. | |
| 2013/0163171 | A1* | 6/2013 | Fujiwara | H04N 5/64 361/679.19 |
| 2014/0313674 | A1 | 10/2014 | Guan | |
| 2018/0077817 | A1* | 3/2018 | Tang-Kong | H05K 7/2039 |
| 2021/0176899 | A1 | 6/2021 | Krippner et al. | |
| 2024/0349456 | A1* | 10/2024 | Patel | H05K 7/20709 |

FOREIGN PATENT DOCUMENTS

| | | | |
|---|---|---|---|
| EP | 0681360 | A2 | 11/1995 |
| WO | 2013092534 | A1 | 6/2013 |
| WO | 2021074405 | A1 | 4/2021 |

* cited by examiner

HEAT SINK FOR POWER ELECTRONICS DEVICES

CROSS-REFERENCE TO RELATED APPLICATIONS

This application claims the benefit of U.S. Provisional Application No. 63/282,294 filed Nov. 23, 2021, the disclosure of which is incorporated herein by reference in its entirety.

BACKGROUND

Exemplary embodiments pertain to the power electronics such as in a coil unit, and more particularly, to a heat sink for cooling power electronics that are mounted within a coil unit.

Power electronic devices such as motor drives can generate waste heat during operation based on the efficiency of the device. Additionally, when the power electronic devices heat up, their efficiency can degrade adding to the amount of heat they generate. Accordingly, there is a need to maintain these power electronic devices within suitable operating levels.

BRIEF DESCRIPTION

In an embodiment, a heat sink for cooling at least one power electronics device in a coil unit includes a base plate having a first portion and a second portion. The second portion is arranged vertically beneath the first portion. A plurality of fins extends from a surface of the base plate. The plurality of fins is located at the second portion of the base plate. A height of the plurality of fins measured perpendicular to the surface varies across a width of the base plate.

In addition to one or more of the features described herein, or as an alternative, further embodiments the base plate includes a central portion and at least one end portion, and a height of the plurality of fins at the central portion is different than a height of the plurality of fins at the at least one end portion.

In addition to one or more of the features described herein, or as an alternative, further embodiments the height of the plurality of fins at the central portion is greater than the height of the plurality of fins at the at least one end portion.

In addition to one or more of the features described herein, or as an alternative, further embodiments the height of the plurality of fins the at least one end portion varies such that the fins at the end portion have a taper.

In addition to one or more of the features described herein, or as an alternative, further embodiments another plurality of fins extends form the surface of the base plate, the another plurality of fins being arranged within the first portion.

In addition to one or more of the features described herein, or as an alternative, further embodiments the base plate includes a central portion and at least one end portion, and the another plurality of fins includes a first plurality of fins arranged at the central portion.

In addition to one or more of the features described herein, or as an alternative, further embodiments the first plurality of fins are substantially identical.

In addition to one or more of the features described herein, or as an alternative, further embodiments a height of the first plurality of fins varies to form a curvature.

In addition to one or more of the features described herein, or as an alternative, further embodiments the another plurality of fins includes a second plurality of fins arranged at the at least one end.

In addition to one or more of the features described herein, or as an alternative, further embodiments the second plurality of fins are substantially identical.

In addition to one or more of the features described herein, or as an alternative, further embodiments a height of the second plurality of fins varies to form a curvature.

In addition to one or more of the features described herein, or as an alternative, further embodiments a height of the second plurality of fins is different relative to a height of the first plurality of fins.

In addition to one or more of the features described herein, or as an alternative, further embodiments no fins are arranged at the first portion of the base plate.

In an embodiment, a coil unit includes a heat exchanger, a fan assembly mounted to the heat exchanger, at least one power electronic device, and a heat sink mounted adjacent to the at least one power electronic device. The fan assembly is operable to move an airflow through the heat exchanger and across the heat sink. The heat sink further comprises a base plate having a first portion vertically aligned with a portion of the fan assembly and a second portion arranged vertically below the fan assembly. A plurality of fins extends from the second portion of the base plate. A height of the plurality of fins measured perpendicular to the base plate varies across a width of the base plate.

In addition to one or more of the features described herein, or as an alternative, further embodiments a height of the plurality of fins varies to form at least one angled surface.

In addition to one or more of the features described herein, or as an alternative, further embodiments no fins are arranged at the first portion of the base plate.

In addition to one or more of the features described herein, or as an alternative, further embodiments comprising another plurality of fins arranged at the first portion of the base plate, wherein a configuration of the another plurality of fins is different than a configuration of the plurality of fins.

In addition to one or more of the features described herein, or as an alternative, further embodiments a gap is defined between the another plurality of fins arranged within the first portion and the fan assembly.

In addition to one or more of the features described herein, or as an alternative, further embodiments the gap varies over the width of the base plate.

In addition to one or more of the features described herein, or as an alternative, further embodiments the gap is at least about 5 mm.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
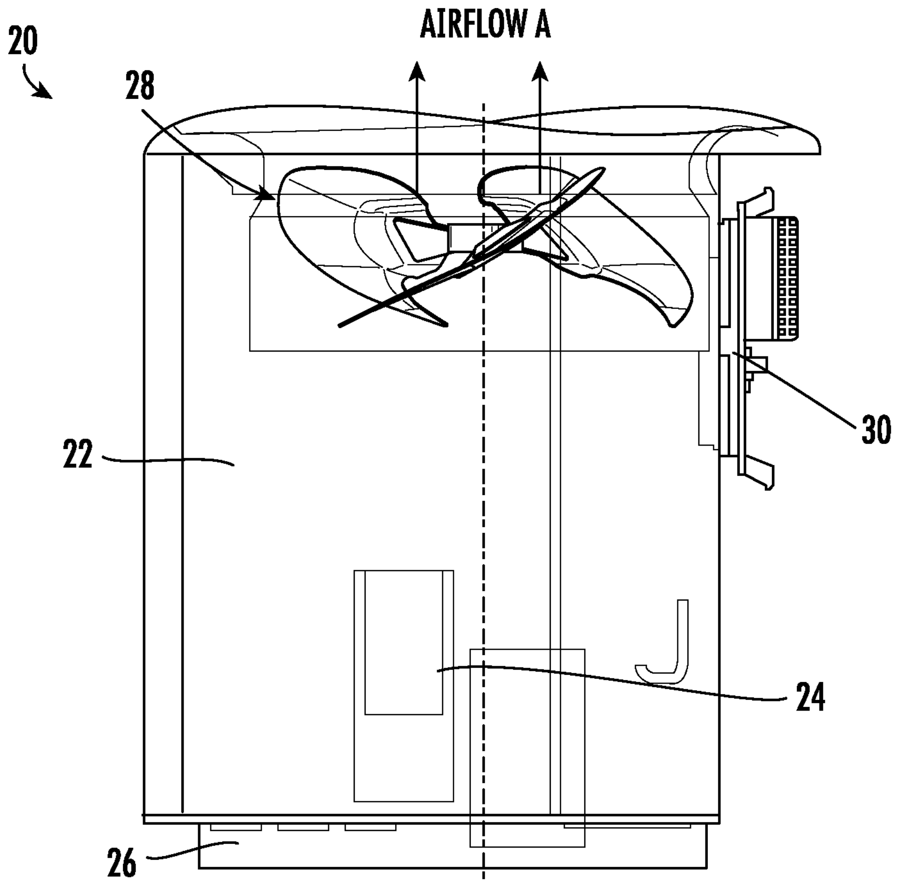
FIG. 1 is a side view of an example of a coil unit of a heating, ventilation, and air conditioning (HVAC) system according to an embodiment.

With reference now to FIG. 1, an example of an outdoor unit or coil unit 20 of a heating, ventilation, and air conditioning (HVAC) system is illustrated. The coil unit 20 includes a heat exchanger 22 and a compressor 24 fluidly coupled to the heat exchanger 22 and configured to pump refrigerant through the HVAC system. In the illustrated, non-limiting embodiment, the compressor 24 is positioned within the interior of the heat exchanger 22; however, embodiments having a compressor 24 arranged at another location are also contemplated herein. Further, the planform of the heat exchanger 22 may be any suitable shape, including but not limited to square, rectangular, circular, or another shape. The coil unit 20 may include a floor pan or base pan 26 configured to receive the heat exchanger 22 and maintain the heat exchanger 22 at a desired position. Arranged generally adjacent to a surface of the heat exchanger 22 is a fan assembly 28 configured to draw ambient air radially inward, through the heat exchanger 22 after which the heated air A is discharged upwardly through an opening (not shown).

In the illustrated, non-limiting embodiment, the compressor 24 is a variable speed compression device having a variable speed motor driven by a variable frequency drive (VFD). The one or more power electronic devices 30 that form the variable frequency drive may be mounted within the coil unit 20, such as between two adjacent ends of the heat exchanger 22.

Because the at least one power electronic device 30 generates waste heat during operation, the coil unit 20 includes a heat sink 32 configured to remove heat from the power electronic devices 30. In an embodiment, the airflow A being driven through the coil unit 20 by the fan assembly 28 is used as a cooling fluid to remove heat from the power electronic devices 30 via the heat sink 32. However, it should be understood that the heat sink 32 as described herein may be used in combination with other means for cooling the power electronic devices 30, such as a refrigerant heat exchanger for example.

Figure 8A:
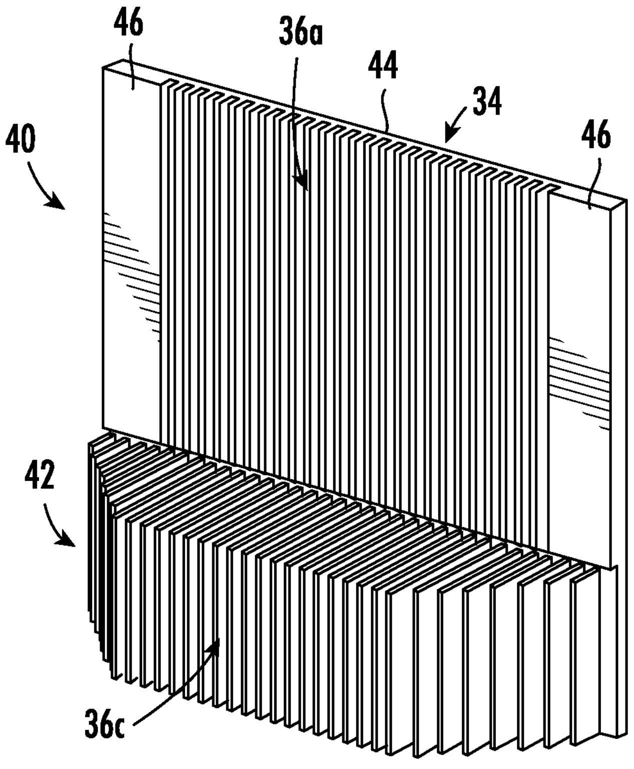
FIG. 8A is a perspective view of a heat sink according to another embodiment.
Figure 8B:
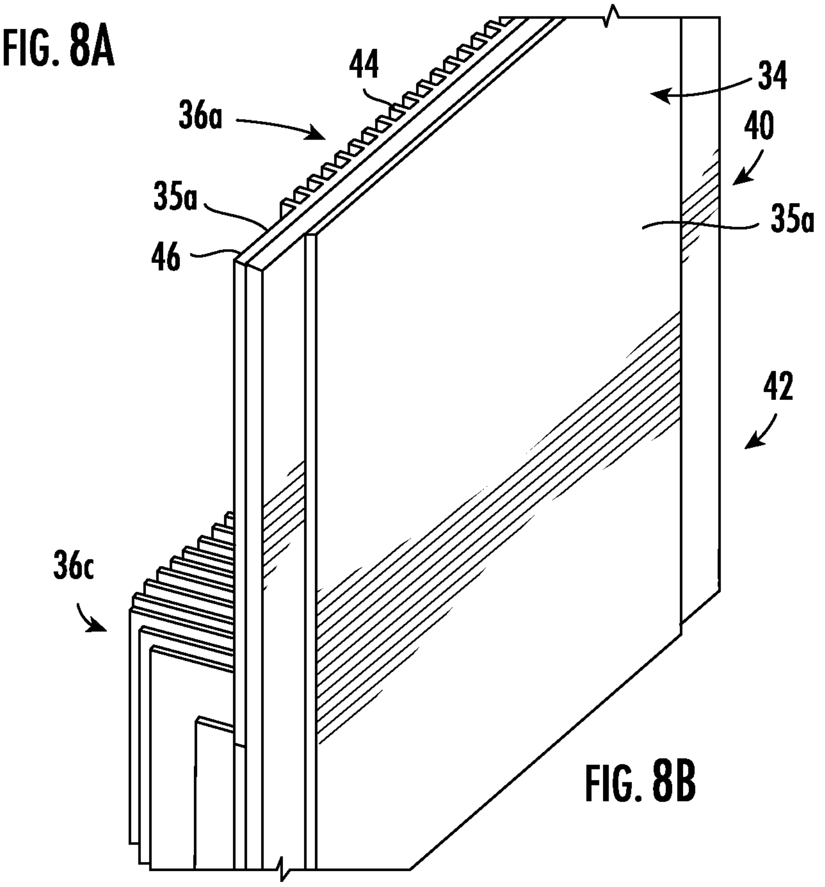
FIG. 8B is a rear perspective view of a heat sink according to an embodiment.

In the various embodiments of the heat sink 32 illustrated herein, the heat sink 32 includes a base plate 34 and a plurality of fins 36 extending from one or more portions of the base plate 34. The base plate 34 is formed from a thermally conductive material and is mounted at an interior of the coil unit 20, in axial alignment with at least a portion of the power electronics devices 30. The base plate 34 may be made from a single material. However, embodiments where the base plate 34 includes a plurality of different materials are also contemplated herein. For example, as best shown in FIG. 8B, the base plate 34 includes a plurality of layers 35*a*, 35*b* of different materials. In an embodiment, the material of the layer 35*a* of the base plate 34 configured to mount and receive heat from the power electronic devices 30 has a higher thermal conductivity than the remainder of the layers of the base plate. In an embodiment, the layer 35*a* of the base plate 34 configured to mount and receive heat from the power electronic devices 30 is a copper material.

Figure 2:
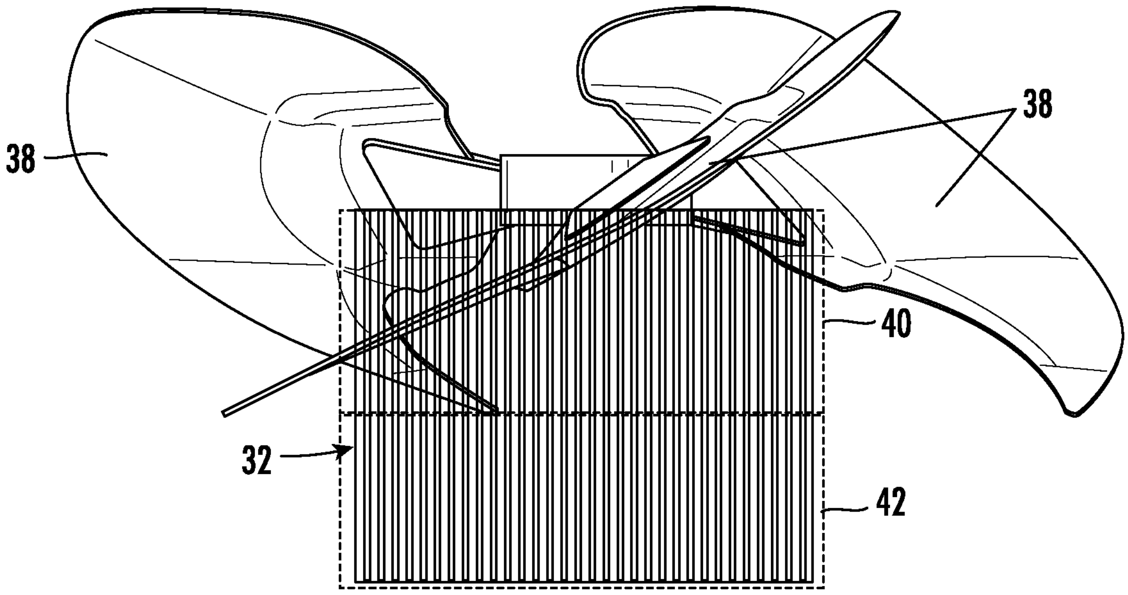
FIG. 2 is a side view of a heat sink and a portion of a fan assembly of a coil unit according to an embodiment.
Figure 3A:
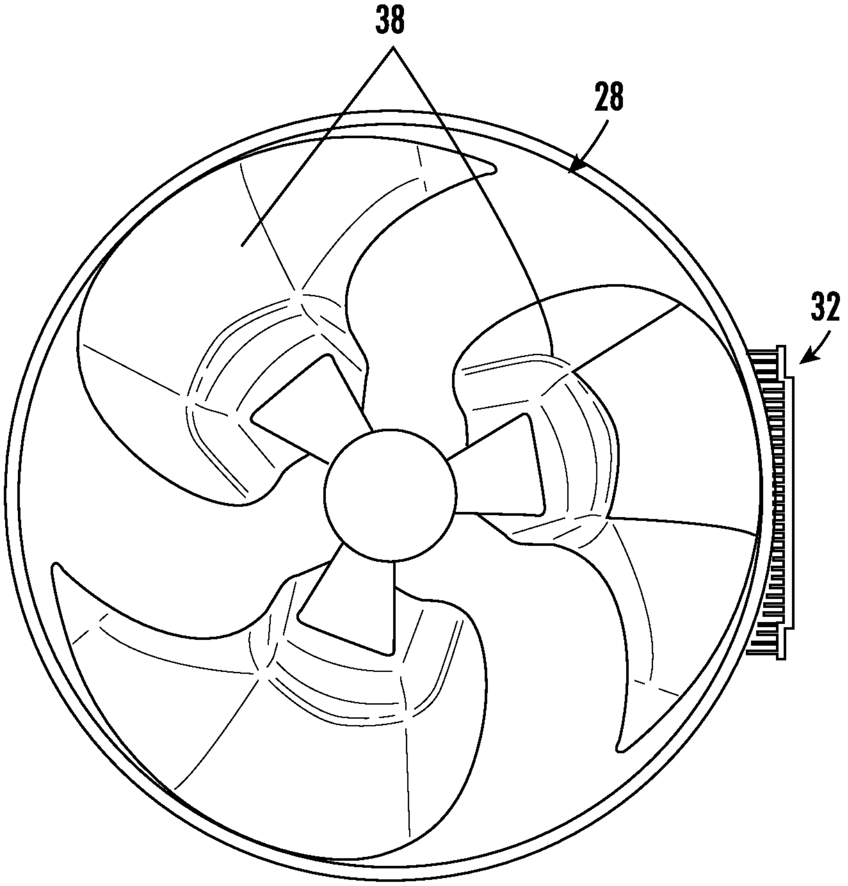
FIG. 3A is a plan view of a portion of the fan assembly and a heat sink according to an embodiment.
Figure 3B:
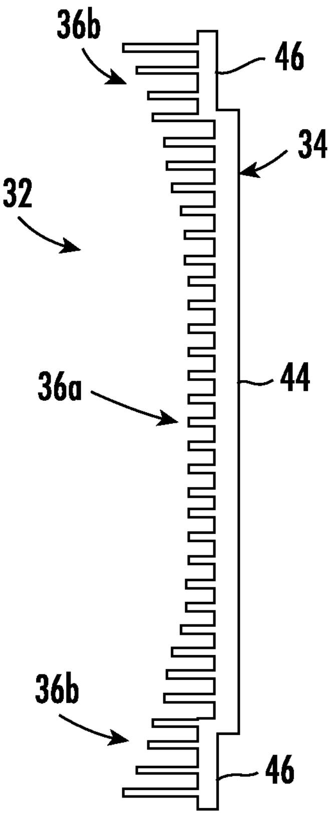
FIG. 3B is a plan view of the heat sink of FIG. 3A according to an embodiment.
Figure 3C:
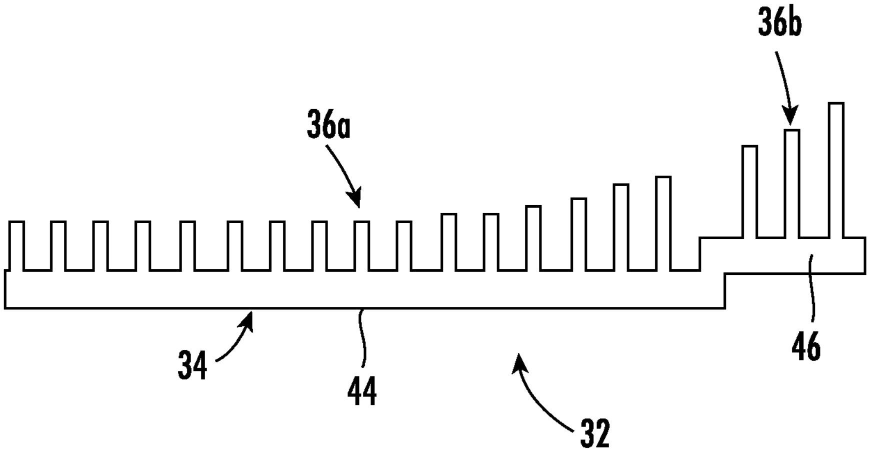
FIG. 3C is an enlarged plan view of the heat sink of FIG. 3A positioned relative to an outer edge of a fan blade according to an embodiment.
Figure 4:
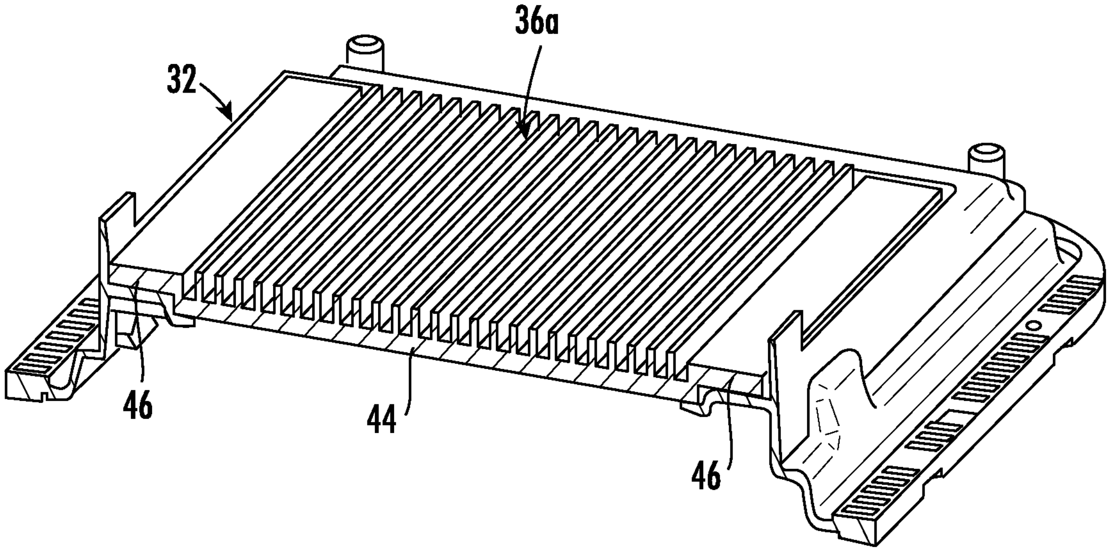
FIG. 4 is a perspective view of a heat sink according to another embodiment.
Figures 5A, 5B, 5C, 5D:
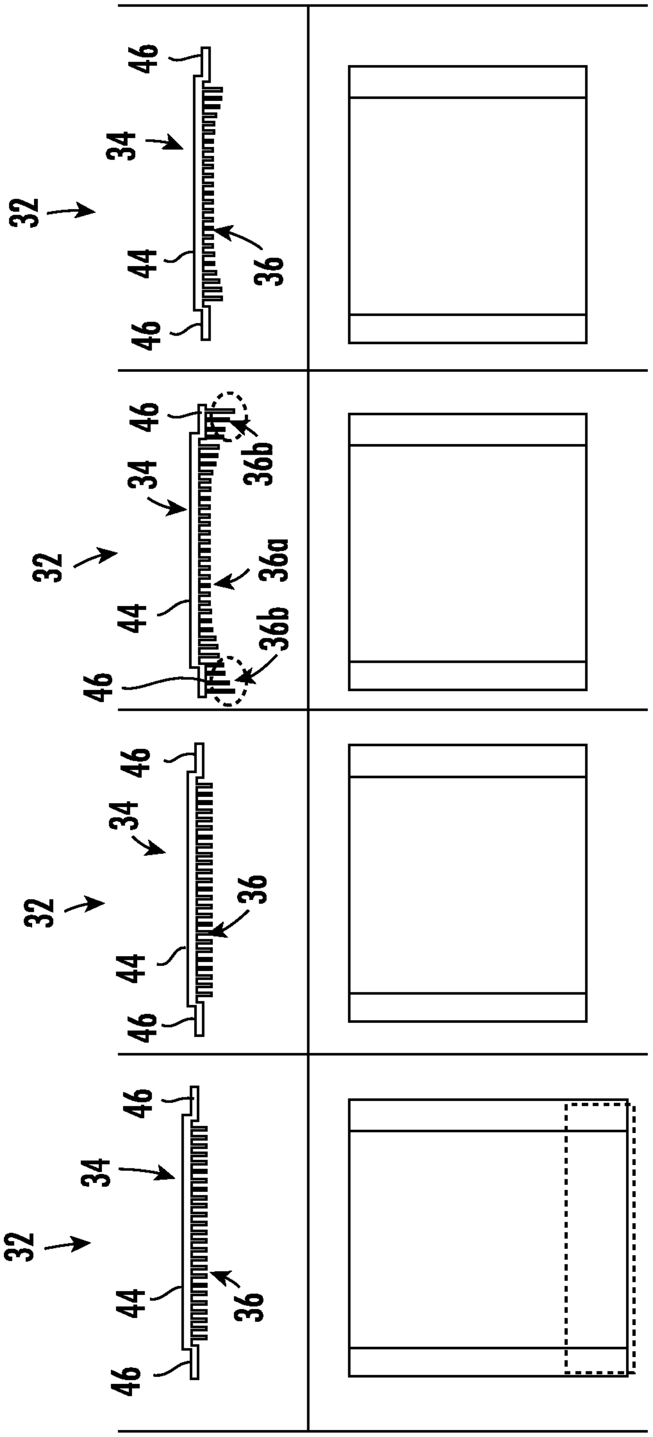
FIGS. 5A-5D are diagrams illustrating various configurations of a heat sink according to an embodiment.
Figure 6A:
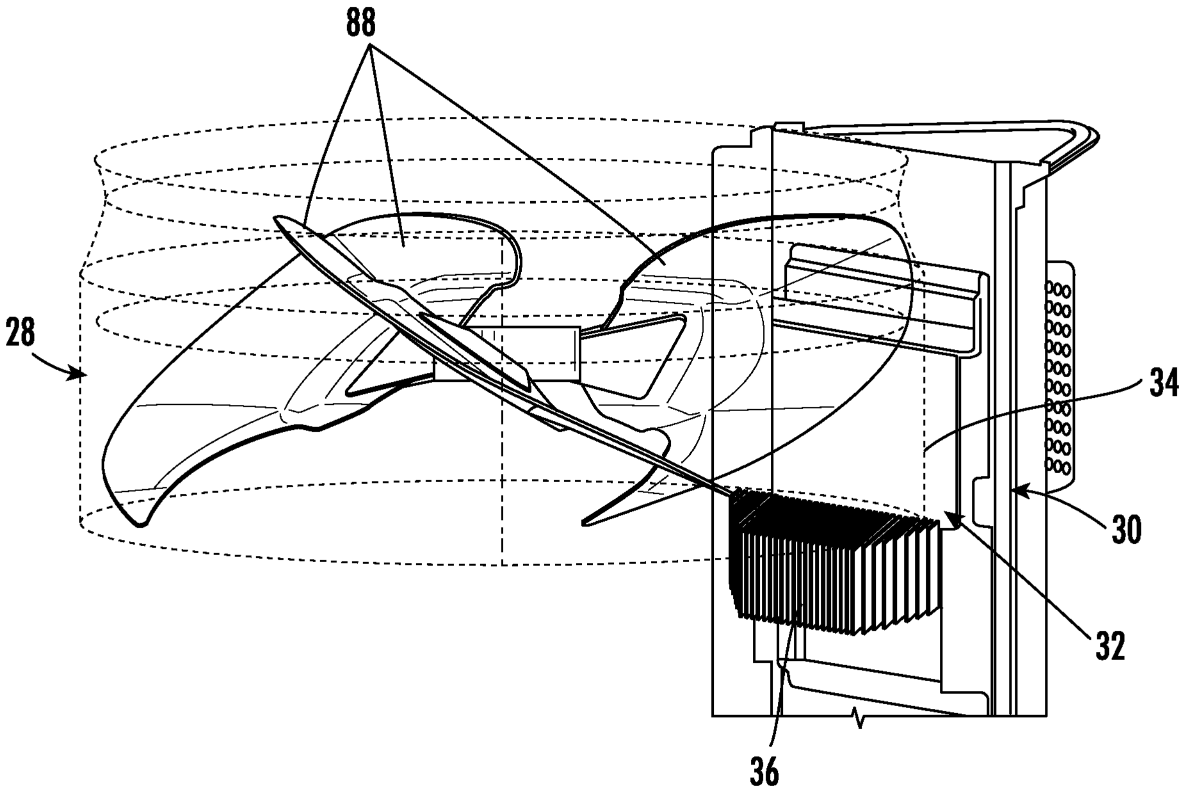
FIG. 6A is a perspective view of the fan assembly and a heat sink of a coil unit according to an embodiment.
Figure 6B:
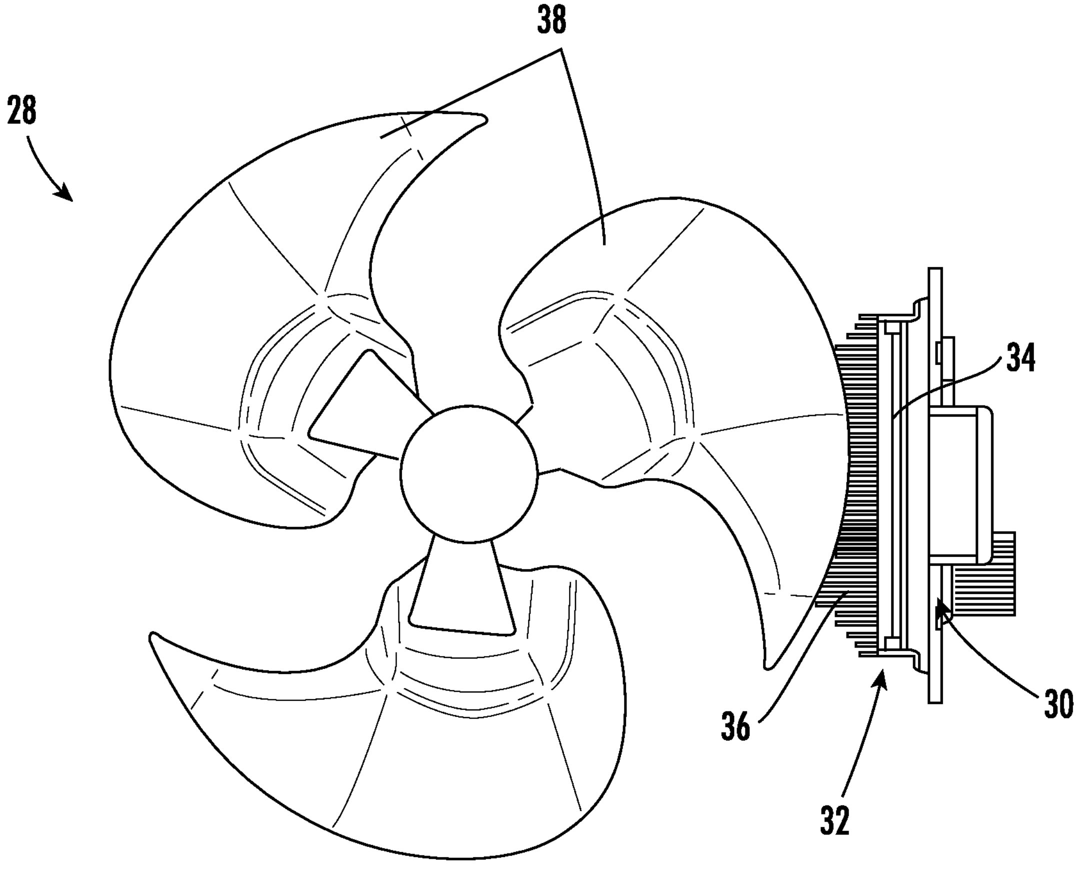
FIG. 6B is a plan view of a portion of the fan assembly and the heat sink of FIG. 6A according to an embodiment.
Figure 6C:
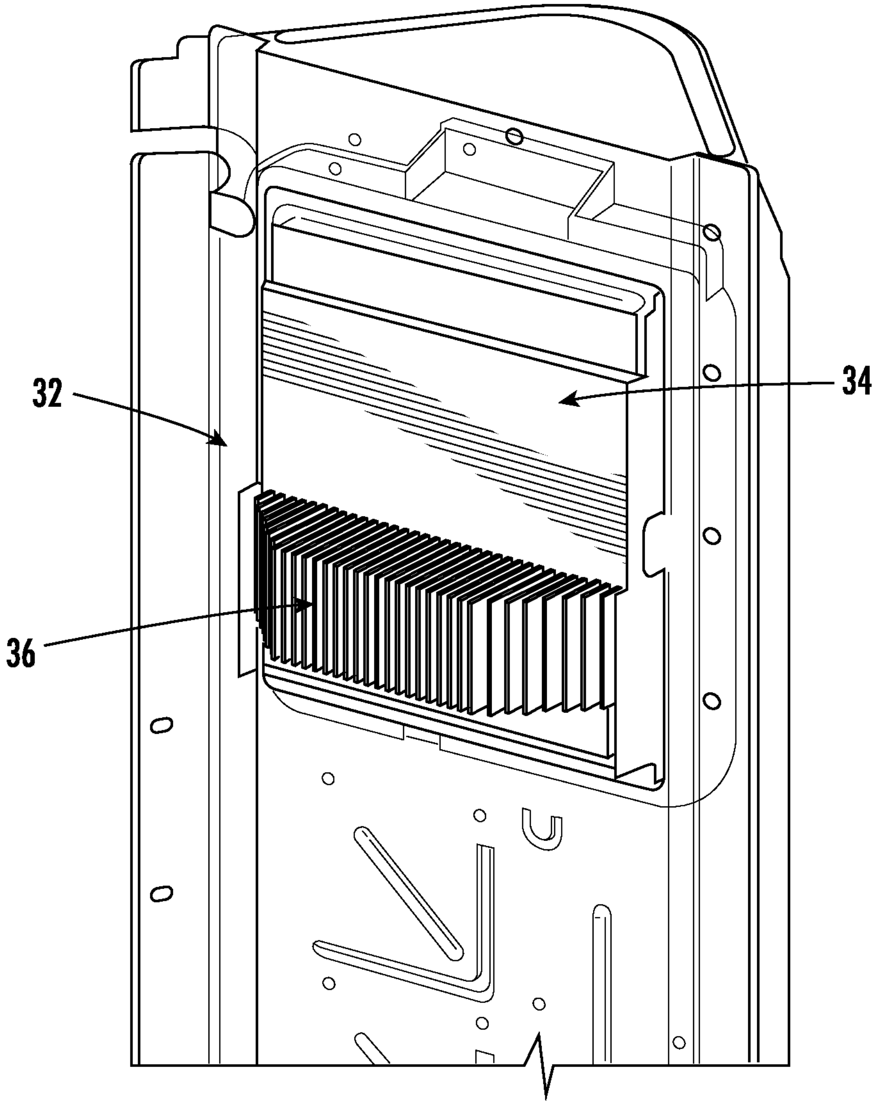
FIG. 6C is a perspective view of the heat sink of FIG. 6A according to an embodiment.
Figure 6D:
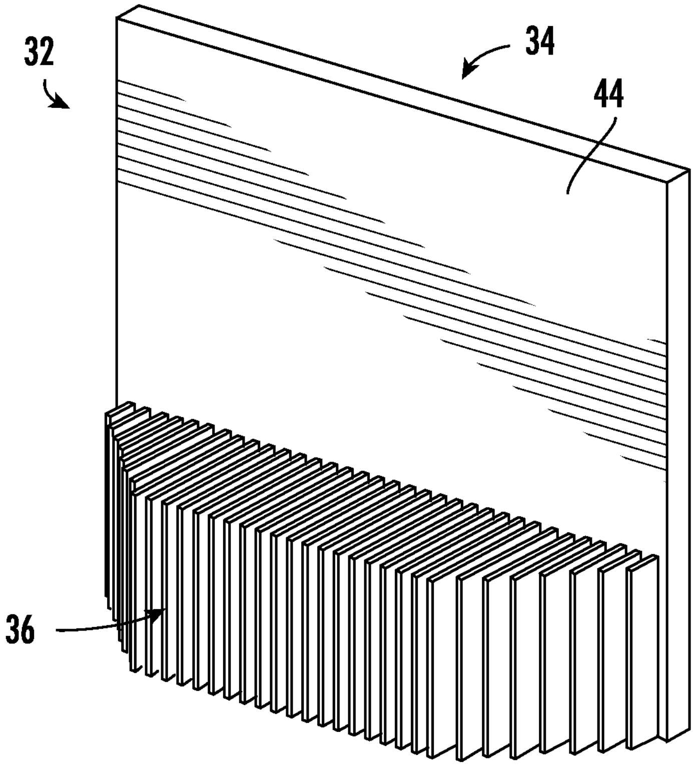
FIG. 6D is a perspective view of the heat sink of FIGS. 6A-6C according to an embodiment.

In an embodiment, all or at least a portion of the base plate 34 is also in vertical alignment, for example within the same horizontal plane, with a portion of the rotatable blades 38 of the fan assembly 28. Further, the base plate 34 may be elongated in length such that when installed relative to the coil unit 20, a first portion 40 of the base plate 34 is arranged horizontally adjacent to the fan blades 38 and a second portion 42 of the base plate 34 is disposed vertically below the fan blades 38 (see FIG. 2).

In the illustrated, non-limiting embodiment, best shown in FIGS. 3A-3C, 4, and 5, the base plate 34 has a non-planar configuration. As shown, the base plate 34 is substantially symmetrical and includes a central portion 44 and at least one end portion 46, such as two end portions 46 arranged at opposite sides of the central portion 44. The end portions 46 may be offset from the plane of the central portion 44. In such embodiments, the end portions 46 may be defined via a first and second bend formed in the base plate 34. However, it should be understood that embodiments where at least a portion of the base plate 34 has another configuration, such as a substantially planar configuration (see FIGS. 6A-6D), are also within the scope of the disclosure.

The plurality of fins 36 extends from one or more surfaces of the base plate 34, such as from the first portion 40 and/or the second portion 42 at a first surface, toward an interior of the coil unit 20. Although the plurality of fins 36 is shown extending substantially perpendicularly from the base plate 34, embodiments where one or more of the fins 36 extends at another angle are also contemplated herein. The fins 36 may extend across the entire width or only a portion of the width of the base plate 34. In an embodiment, the plurality of fins 36 is located at only the central portion 44 of the base plate 34 (see FIGS. 4, 5A, 5B, and 5D). However, in other embodiments, a first plurality of fins 36*a* is located at the central portion 44 of the base plate 34 and a second plurality of fins 36*b* is located at one or both of the end portions 46 of the base plate 34.

The configuration of the plurality of fins 36 may be substantially identical. Accordingly, in instances where the heat sink 32 includes a plurality of first fins 36*a* and a plurality of second fins 36*b*, the configuration of each of the first plurality of fins 36*a* is identical to each of the second plurality of fins 36*b*. However, in other embodiments, the configuration of the second plurality of fins 36*b* differs from the configuration of the first plurality of fins 36*a*. Further, the configuration of each fin within the first plurality of fins 36*a* and/or the second plurality of fins 36*b* may be substantially identical, or may vary. For example, in an embodiment best shown in FIGS. 3A-3C, the first plurality of fins 36*a* arranged at the central portion 44 of the base plate 34 vary in height, measured perpendicular to the surface of the base plate 34. For example, the height of the fins 36*a* may gradually increase (uniformly or non-uniformly) from the center of the central portion 44 of the base plate 34 toward the end portions 46 thereof.

Because the plurality of fins 36*a* and/or 36*b* are positioned radially outward of the fan blades 38 (see FIG. 3A), the height of the fins 36*a* and/or 36*b* may vary across the width of the base plate 34 to achieve a general curvature (viewed via a plan view), such as a curvature similar to the periphery of the adjacent fan blades 38. For example, in one of the non-limiting embodiments illustrated in FIG. 5, the heat sink 32 only includes a first plurality of fins 36*a* mounted at the central portion 44 of the base plate 34 and the height of the fins 36*a* varies to form a curvature. In another embodiment illustrated in FIGS. 3A-3C and 5C, the base plate 34 includes a first plurality of fins 36*a* at the central portion 44 and a second plurality of fins 36*b* at the end portions 46, and the first and second plurality of fins 36*a*, 36*b* cooperate to define a curvature. However, embodiments where the curvature is only defined by varying either the first plurality of fins 36*a* or the second plurality of fins 36*b*, but not both, is also contemplated herein.

In an embodiment, the height of the fins 36*a* and/or 36*b* is selected to maintain a constant radius defined by the fins, or alternatively, to maintain a constant gap between the fan blades 38 and the fins 36*a* and/or 36*b*. However, in an embodiment, the gap measured parallel to the height of the fins 36*a* and/or 36*b* may vary over the width of the base plate 34. For example, the gap between the first plurality of fins 36*a* arranged at the middle of the central portion 44 of the base plate 34 and the fan blades 38 may be less than the gap between the first plurality of fins 36*a* closest to the end portions 46 or the second plurality of fins 36*b* at the end portions 46 of the base plate 34 and the fan blades 38. Regardless of whether the gap is constant or variable, a minimum gap between the fan blades 38 and the fins 36*a* and/or 36*b* is at least about 5 mm and in some embodiments, the gap between the fins 36*a* and/or 36*b* and the fan blades 38 may range from about 5 mm to about 10 mm, or from about 5 mm to about 12 mm.

In another embodiment, regardless of the configuration of the base plate 34, the height of the fins 36*a* and/or 36*b* may gradually increase from the end portion 46 of the base plate 34 towards the central portion 44 of the base plate 34. For example, in the non-limiting embodiment, of FIGS. 6A-6D, the base plate 34 includes a first plurality of fins 36*a* and a second plurality of fins 36*b*, and the height of the fins 36*b* located at each end portion 46 of the base plate 34 is shorter than the height of the fins 36*a* arranged at the center 44 of the base plate 34. As shown, the height of the outermost fins 36*b* may taper from the maximum to the minimum such that in a plan view, the fins 36*a* and 36*b* appear to have or form at least one angled surface. In the illustrated, non-limiting embodiment, the height of the fins 36*b* varies such that the fins form a symmetrical trapezoid (see FIG. 6D).

The first and/or the second plurality of fins 36*a*, 36*b* may be configured to extend over the substantial entirety, or alternatively, over only a portion of a length of the base plate 34. In the illustrated, non-limiting embodiment, best shown in FIGS. 2-5, the first and/or second plurality of fins 36*a* and/or 36*b* extends over the substantially entire length of the base plate 34, measured parallel to the fan axis X. In such embodiments, the base plate 34, may but need not include the second portion 42 disposed vertically below the fan blades 38. In another embodiment, the first and/or second plurality of fins 36*a*, 36*b* extends over only a portion of the length of the base plate 34, such as over only the first portion 40 of the base plate 34 aligned with the plurality of fan blades 38, or alternatively, over only the second portion 42 of the base plate 34 arranged vertically below the fan blades 38 (see FIGS. 6A-6D).

Figure 7:
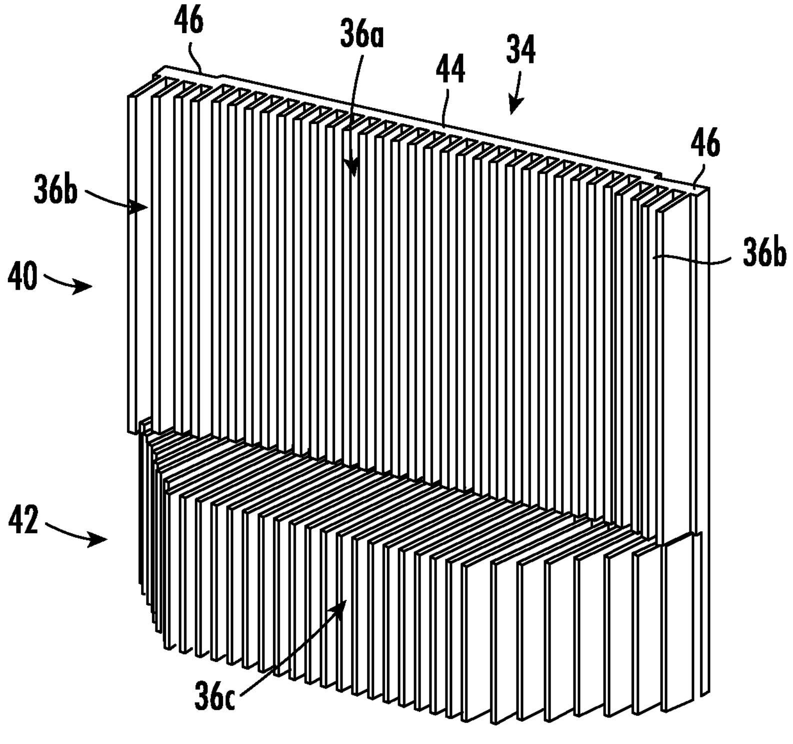
FIG. 7 is a perspective view of a heat sink according to another embodiment.

Further, with reference now to FIG. 7, in an embodiment, the first portion 40 of the base plate 34 aligned with the fan blades 38 may have a first plurality of fins 36*a* arranged at the central portion 44 and a second plurality of fins 36*b* arranged at the ends 46 of the first portion 40 of the base plate 34 as previous described herein. In an embodiment, the second portion 42 of the base plate 34 located underneath the fan blades 38 includes a third plurality of fins 36*c*. The third plurality of fins 36*c* may extend over the entire width, or alternatively, over only a portion of the width of the base plate 34. In other embodiments, best shown in FIGS. 8A and 8B, the first portion 40 of the base plate 34 may have only the first plurality of fins 36*a* arranged at the central portion 44, or alternatively, only the second plurality of fins 36*b* arranged at at least one end portion 46, while the second portion 42 of the base plate 34 located underneath the fan blades 38 includes the third plurality of fins 36*c*.

In embodiments where the heat sink 32 includes fins 36 within both the first portion 40 and the second portion 42 of the base plate 34, a fin within the second portion 42 may be vertically aligned with an adjacent fins of the first portion 40 to define an uninterrupted fluid flow path extending over an entire length of the base plate 34. However, embodiments where vertically stacked fins 36 are offset from one another are also within the scope of the disclosure.

The configuration of the base plate 34, the first plurality of fins 36*a*, the second plurality of fins 36*b*, and/or the third plurality of fins 36*c* may vary based on the loading of the HVAC system as well as the adjacent components within the coil unit 20. For example, in the illustrated, non-limiting embodiment of FIG. 7, the fin height of the first plurality of fins 36*a* and the second plurality of fins 36*b* varies to forms a curvature when viewed in plan form. However, in the embodiments of FIGS. 8A and 8B, the first plurality of fins 36*a* has a substantially uniform height. Because the third plurality of fins 36*c*, is positioned underneath the fan assembly 28, in an embodiment, the maximum fin height of the third plurality of fins 36*c* is substantially greater than a maximum fin height of the first plurality of fins 36*a*, and in some embodiments, than the second plurality of fins 36*b*. In the illustrated, non-limiting embodiment, the fin height of the third plurality of fins 36*c* increases from the edge portions 46 of the base plate 34 toward the central portion 44 to form a contour having angled sides when viewed in plan form. However, it should be understood that a heat sink 32 having any suitable fin configuration that does not interfere with the adjacent components of the coil unit 20 are within the scope of the disclosure.

As the fan blades 38 rotate about the fan axis, the airflow A moved by the fan assembly 28 moves over and through the plurality of fins 36 of the base plate, thereby removing heat from the fins 36 and the base plate 46 of the heat sink 32 and cooling the at least one power electronics device 30. A coil unit 20 having a heat sink 32 as illustrated and described herein will enhance the heat transfer from the power electronic devices 30, thereby increasing the efficiency of the coil unit 20.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A heat sink for cooling at least one power electronics device in a coil unit having a fan including at least one fan blade rotatable about a fan axis, the heat sink comprising:

a base plate having a first lateral side and a second lateral side and a planar surface extending between the first lateral side and the second lateral side including a first portion and a second portion, the second portion being stacked relative to the first portion along an axis, the first portion being positionable in radial alignment with the at least one fan blade and the second portion being offset from the at least one fan blade along the fan axis, the axis being parallel to the fan axis;

a plurality of fins protruding from the second portion of the surface of the base plate, the plurality of fins extending along an axis from the first lateral side to the second lateral side and protrude from the surface, wherein an end of each of the plurality of fins is coplanar with the surface and a height of the plurality of fins measured perpendicular to the surface varies across a width of the base plate between the first lateral side and the second lateral side; and wherein another plurality of fins extends from the surface of the base plate, the another plurality of fins being arranged within the first portion.

2. The heat sink of claim 1, wherein the base plate includes a central portion and at least one end portion, and a height of the plurality of fins at the central portion is different than a height of the plurality of fins at the at least one end portion.

3. The heat sink of claim 2, wherein the height of the plurality of fins at the central portion is greater than the height of the plurality of fins at the at least one end portion.

4. The heat sink of claim 2, wherein the height of the plurality of fins at the at least one end portion varies such that a distal end of the plurality of fins at the at least one end portion are arranged within an angled plane.

5. The heat sink of claim 1, wherein the base plate includes a central portion and at least one end portion, and the another plurality of fins includes a first plurality of fins arranged at the central portion.

6. The heat sink of claim 5, wherein the first plurality of fins are identical.

7. The heat sink of claim 5, wherein a height of the first plurality of fins varies to form a curvature.

8. The heat sink of claim 5, wherein the another plurality of fins includes a second plurality of fins arranged at the at least one end portion.

9. The heat sink of claim 8, wherein the second plurality of fins are substantially identical.

10. The heat sink of claim 8, wherein a height of the second plurality of fins varies to form a curvature.

11. The heat sink of claim 8, wherein a height of the second plurality of fins is different relative to a height of the first plurality of fins.

12. The heat sink of claim 1, wherein no fins are arranged at the first portion of the base plate.

13. A coil unit comprising:

a heat exchanger;

a fan assembly mounted to the heat exchanger, the fan assembly including a fan rotor including a plurality of fan blades rotatable about a vertically oriented fan axis;

at least one power electronic device;

a heat sink mounted adjacent to the at least one power electronic device, wherein the fan assembly is operable to move an airflow through the heat exchanger and across the heat sink, the heat sink further comprising:

a base plate having a surface parallel to and offset from the fan axis, a first portion of the surface is radially aligned with the plurality of fan blades and a second portion of the surface is arranged vertically below the plurality of fan blades;

a plurality of fins extending from the second portion of the surface of the base plate, wherein a height of the plurality of fins measured perpendicular to the base plate varies across a width of the base plate; wherein at least one of the plurality of fan blades is aligned with the plurality of fins along an axis parallel to the fan axis; and further comprising another plurality of fins arranged at the first portion of the base plate, wherein a configuration of the another plurality of fins is different than a configuration of the plurality of fins.

14. The coil unit of claim 13, wherein a height of the plurality of fins varies such that a distal end of the plurality of fins are arranged within an angled plane.

15. The coil unit of claim 13, wherein a gap is defined between the another plurality of fins arranged within the first portion and the fan assembly.

16. The coil unit of claim 15, wherein the gap varies over the width of the base plate.

17. The coil unit of claim 15, wherein the gap is at least about 5 mm.

* * * * *